(12) United States Patent
Schrom et al.

(10) Patent No.: US 7,015,720 B2
(45) Date of Patent: Mar. 21, 2006

(54) DRIVER CIRCUIT

(75) Inventors: Gerhard Schrom, Hillsboro, OR (US);
Peter Hazucha, Beaverton, OR (US);
Jae-Hong Hahn, Beaverton, OR (US);
Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/749,928

(22) Filed: Dec. 29, 2003

(65) Prior Publication Data

US 2005/0146356 A1    Jul. 7, 2005

(51) Int. Cl.
*H03K 19/0175* (2006.01)

(52) U.S. Cl. .............................. 326/82; 326/31; 326/34

(58) Field of Classification Search ............ 326/31–34, 326/82–83; 327/108, 109, 110, 111
See application file for complete search history.

(56) References Cited

U.S. PATENT DOCUMENTS

| 4,728,817 A | * | 3/1988 | Jessee et al. | ................. 327/109 |
| 6,556,053 B1 | * | 4/2003 | Stanley | ....................... 327/108 |

* cited by examiner

*Primary Examiner*—Anh Q. Tran
(74) *Attorney, Agent, or Firm*—Schwegman, Lundberg, Woessner & Kluth, P.A.

(57) ABSTRACT

A circuit includes a first driver, a second driver, and a transformer coupled to the first and second driver. In operation, the first driver receives a first signal from a first input port, the second driver receives a time-delayed version of the first signal from a second input port, and the transformer provides provide an output signal to an output port. A method includes receiving a first input signal, receiving a second input signal, and then processing the first input signal and the second input signal. The second input signal is a time-delayed version of the first input signal and the processing of the first input signal and the second input signal generates a half-raised cosine signal.

24 Claims, 6 Drawing Sheets

DRIVER CIRCUIT

FIELD

This invention relates to circuits. More particularly, this invention relates to driver circuits for driving capacitive loads.

BACKGROUND

Many driver circuits have been developed. Some of these driver circuits are used to drive capacitive loads (such as power transistors), and some of the capacitive loads are included in power conversion circuits. Unfortunately, many of the driver circuits included in power conversion circuits dissipate power in the transistors that drive the capacitive loads. As the number of components included in integrated circuits increases, the number of power conversion circuits included in these integrated circuits will also increase, and the demand for circuits that can drive capacitive loads more efficiently (i.e., with less power dissipation) will increase.

DESCRIPTION

Figure 1A:
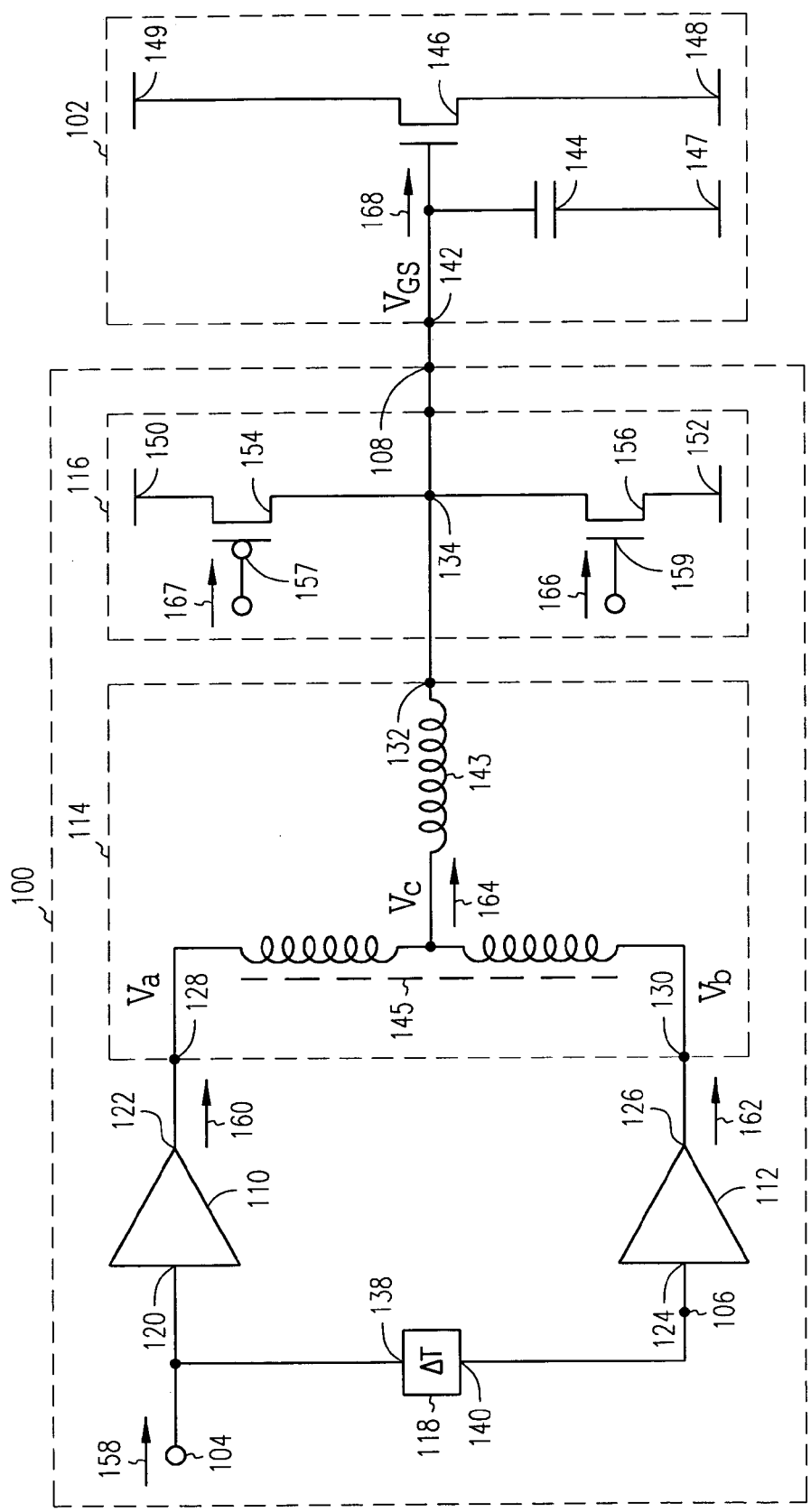
FIG. 1A is a block diagram and a schematic diagram of a circuit and a load in accordance with some embodiments of the present invention.

In the following description of some embodiments of the present invention, reference is made to the accompanying drawings which form a part hereof, and in which are shown, by way of illustration, specific embodiments of the present invention which may be practiced. In the drawings, like numerals describe substantially similar components throughout the several views. These embodiments are described in sufficient detail to enable those skilled in the art to practice the present invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

FIG. 1A is a block diagram and a schematic diagram of a circuit 100 and a load 102 in accordance with some embodiments of the present invention. The circuit 100 includes input ports 104 and 106, an output port 108, drivers 110 and 112, a transformer circuit 114, a clamp circuit 116, and a delay circuit 118. The driver 110 includes a driver input port 120 and a driver output port 122. The driver 112 includes a driver input port 124 and a driver output port 126. The transformer circuit 114 includes transformer circuit input ports 128 and 130 and a transformer circuit output port 132. The clamp circuit 116 includes a clamp circuit input/output port 134. The delay circuit 118 includes a delay circuit input port 138 and a delay circuit output port 140. The load 102 includes a load input port 142.

The driver input port 120 and the delay circuit input port 138 are coupled to the input port 104. The driver input port 124 is coupled to the delay circuit output port 140. The transformer circuit input port 128 is coupled to the driver output port 122. The transformer circuit input port 130 is coupled to the driver output port 126. The clamp circuit input/output port 134 is coupled to the transformer circuit output port 132 and to the load input port 142.

The drivers 110 and 112 provide signals to the transformer circuit input ports 128 and 130. In some embodiments, the drivers 110 and 112 are transistor drivers and the size of each of the drivers 110 and 112 is selected to be one-half the width of a transistor in a conventional driver circuit that does not include the transformer circuit 114. In some embodiments, the drivers 110 and 112 are transistor drivers and the size of each of the drivers 110 and 112 is selected to be less than one-half the width of a transistor in a conventional driver circuit that does not include the transformer circuit 114. For these embodiments, the transformer circuit 114 includes an inductor 143. The inductor 143 is selected to provide a larger inductance than the inductance in the embodiments in which the size of each of the drivers 110 and 112 is selected to be one-half the width of a transistor in the conventional driver circuit that does not include the transformer circuit 114. In these embodiments, a capacitor 144 included in the load 102 is charged and discharged more slowly than in the embodiments in which the size of each of the drivers 110 and 112 is selected to be one-half the width of the transistor in the conventional driver circuit that does not include the transformer circuit 114.

The transformer circuit 114 provides a signal path that does not substantially dissipate the energy of the signals transmitted from the drivers 110 and 112 to the load 102. In some embodiments, the transformer circuit 114 includes a transformer 145 and the inductor 143. In some embodiments, the transformer 145 includes a tightly coupled (k approximately equal to 1) transformer. An auto-transformer is an exemplary embodiment of a tightly coupled transformer suitable for use in connection with the transformer circuit 114. The inductance of an auto-transformer is selected to be fairly high so that the energy stored in the auto-transformer is negligible. In some embodiments, the transformer 145 includes a loosely coupled transformer. A loosely coupled transformer has an effective output impedance equivalent to an inductor coupled to the center tap of a transformer, so a loosely coupled transformer does not require the inductor 143.

The load 102 includes the capacitor 144, a transistor 146, and potential nodes 147, 148, and 149. The transistor 146 is coupled to the capacitor 144. The capacitor 144 models the gate capacitance of the transistor 146. In some embodiments, the transistor 146 includes a large switching transistor. A switching transistor is capable of turning on and off quickly (rise time on the order of a few nanoseconds or less). A large switching transistor is capable of providing large currents (currents on the order of about one ampere or more) while turning on and off quickly.

The clamp circuit 116 assists in maintaining the voltage at the capacitor 144 at the potential of potential nodes 150 and 152 once the capacitor 144 is charged. Although the clamp circuit 116 is not required in the circuit 100, without the clamp circuit 116 resistive losses in the drivers 110 and 112 and the transformer circuit 114 can prevent the voltage at the capacitor 144 from reaching the potentials provided at the potential nodes 150 and 152. In some embodiments, the clamp circuit 116 includes transistors 154 and 156. The transistor 154 includes a control port 157. The transistor 156 includes a control port 159. The size of each of the transistors 154 and 156 is small when compared to the size of the transistors included in the drivers 110 and 112. In some embodiments, the transistors 154 and 156 are small p-type and n-type metal-oxide semiconductor field-effect transistors, respectively.

The delay circuit 118 provides a time delay in the signal path from the driver input port 120 of the driver 110 to the driver input port 124 of the driver 112. In some embodiments, the delay circuit 118 includes an inverter chain. An inverter chain is useful when the desired time delay is small. In some embodiments, the delay circuit 118 includes a capacitor tapped delay line. An exemplary embodiment of a capacitor tapped delay line includes a chain of inverters in which one or more of the inverters include a capacitor, such as metal-oxide semiconductor capacitor, coupled between the inverter signal path and ground. A capacitor tapped delay line is useful when a tunable delay is desired. In some embodiments, the delay circuit 118 includes a clocked circuit, such as a shift register. A clocked circuit is useful when the desired time delay is large.

In some embodiments, the transformer circuit 114 has a leakage inductance and the load 102 includes a capacitive load, such as the capacitor 144, which has a capacitance. For these embodiments, the delay circuit 118 is selected to provide a time delay about equal to the product of pi and the square-root of the product of the leakage inductance and the capacitance.

Figure 1B:
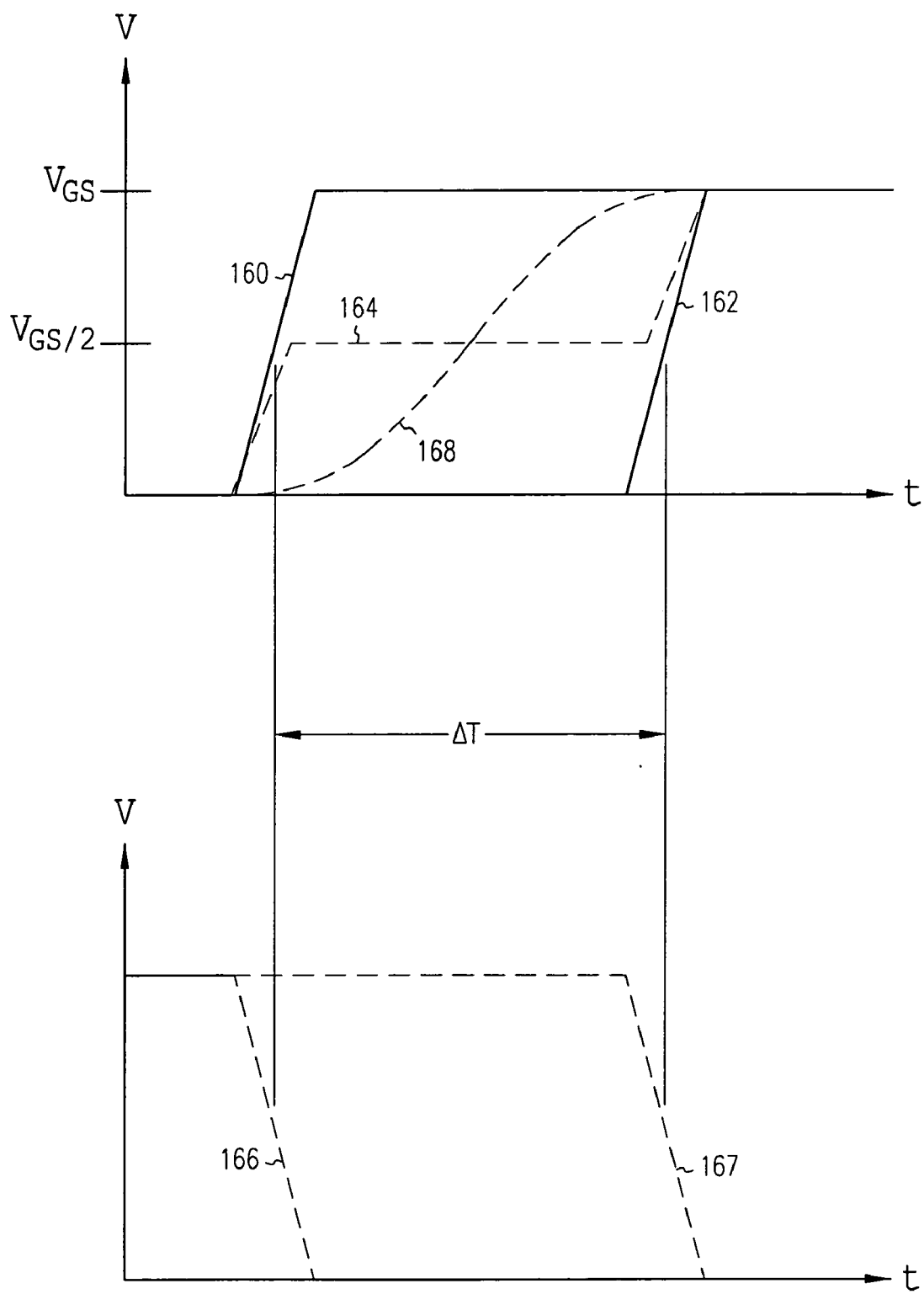
FIG. 1B shows exemplary waveforms in the circuit, shown in FIG. 1A, for a signal (not shown in FIG. 1B) having a rising-edge transition at the input port of the circuit in accordance with some embodiments of the present invention.

FIG. 1B shows exemplary waveforms in the circuit 100, shown in FIG. 1A, for a signal 158 (shown in FIG. 1A, not shown in FIG. 1B) having a rising-edge transition at the input port 104 of the circuit 100 in accordance with some embodiments of the present invention. The description assumes that the potential nodes 147 and 152 are at ground potential (zero volts) and that the potential node 150 is at Vcc. The waveforms shown include a voltage signal 160, Va, at the transformer circuit input port 128, a voltage signal 162, Vb, at the transformer circuit input port 130, a voltage signal 164, Vc, at the center-tap of the transformer 145, and a voltage signal 168, VGs, at the load input port 142. When the signal 158, at the input port 104 of the circuit 100, transitions from low-to-high, the transistor 156 in the clamp circuit 116 is turned off (a control signal 166 at the control port 159 of the transistor 156 transitions from high-to-low) and the voltage signal 160, Va, at the transformer circuit input port 128 rises to the supply voltage Vcc. After a delay $\Delta T$, the voltage signal 162, Vb, at the transformer circuit input port 130 rises and the transistor 154 in the clamp circuit 116 is turned on (a control signal 167 at the control port 157 of the transistor 154 transitions from high-to-low). The voltage signal 164, at the center-tap of the transformer 145, $Vc=(Va+Vb)/2$, first rises to Vcc/2 and then to Vcc after the delay $\Delta T$ provided by the delay circuit 118, shown in FIG. 1A. The current signal (not shown) in the inductor 143, has the shape of a sine wave, $\sin(\pi t/\Delta T)$ where $\Delta T = \pi(\sqrt{LC})$. The voltage signal 168, VGs, at the load input port 142 has the shape of a half raised-cosine wave. The timing of the falling transition is accordingly symmetric, i.e., first the transistor 154 in the clamp circuit 116 is turned off (the control signal 167 transitions from low-to-high) and the voltage signal 160, Va, at the transformer circuit input port 128 goes to 0V. After a delay $\Delta T$, the voltage signal 162, Vb, at the transformer circuit input port 130, goes to 0V and the transistor 156 in the clamp circuit 116 is turned on (the control signal 166 transitions from low-to-high). The flux in the core of the transformer 145 is small and changes sign during a rising-edge or falling-edge transition. The flux in the core of the inductor 143 is zero before and after transitions.

Figure 1C:
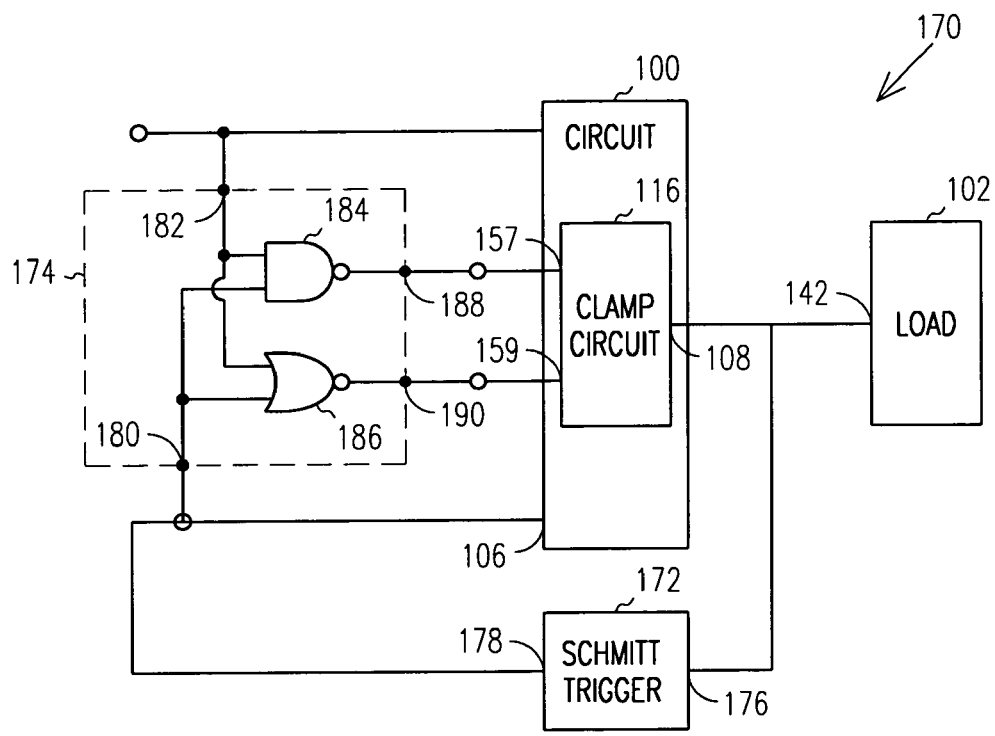
FIG. 1C is a block diagram of a circuit including the circuit and the load, shown in FIG. 1A, a Schmitt trigger to provide a time delay, and logic to provide control signals to the clamp circuit, shown in FIG. 1A, in accordance with some embodiments of the present invention.

FIG. 1C is a block diagram of a circuit 170 including the circuit 100 and the load 102, shown in FIG. 1A, a Schmitt trigger 172 to provide a time delay, and logic 174 to provide control signals to the clamp circuit 116, shown in FIG. 1A, in accordance with some embodiments of the present invention. The Schmitt trigger 172 includes a Schmitt trigger input port 176 and a Schmitt trigger output port 178. The logic 174 includes logic input ports 180 and 182, logic gates 184 and 186, and logic output ports 188 and 190.

The Schmitt trigger input port 176 is coupled to the output port 108 of the circuit 100 and to the load input port 142. The Schmitt trigger output port 178 is coupled to the input port 106 of the circuit 100 and to the logic input port 180. The input port 104 of the circuit 100 is coupled to the logic input port 182. The logic input ports 180 and 182 and the logic output ports 188 and 190 are coupled to the logic gates 184 and 186. The logic output port 188 is coupled to the control port 157 of the transistor 154 in the clamp circuit 116. The logic output port 190 is coupled to the control port 159 of the transistor 156 in the clamp circuit 116.

In operation, the Schmitt trigger 172 in the circuit 170 functions as the delay circuit 118 (shown in FIG. 1A). The Schmitt trigger 172 derives the time delay, $\Delta T$, from the signal (not shown) at the output port 108 of the circuit 100. Deriving the time delay, $\Delta T$, from the signal at the output port 108 of the circuit 100 avoids having to match the time delay, $\Delta T$, to one-half the square root of the product of the value of the inductor 143 (shown in FIG. 1) and the value of the capacitor 144 (shown in FIG. 1). The Schmitt trigger 172 provides hysteresis, that is, one transition level for a low-to-high transition and a different transition level for a high-to-low transition. In some embodiments, the hysteresis (the difference between the transition levels) of the Schmitt trigger 172 is set to the supply voltage. In some embodiments, the hysteresis of the Schmitt trigger 172 is set to a value slightly less than the supply voltage. Setting the hysteresis of the Schmitt trigger 172 to a value slightly less than the supply voltage compensates for the load input port 142 not reaching the ground or the supply completely on its own and for the delay through the drivers 110 and 112 (shown in FIG. 1A) and the logic 174.

Figure 2:
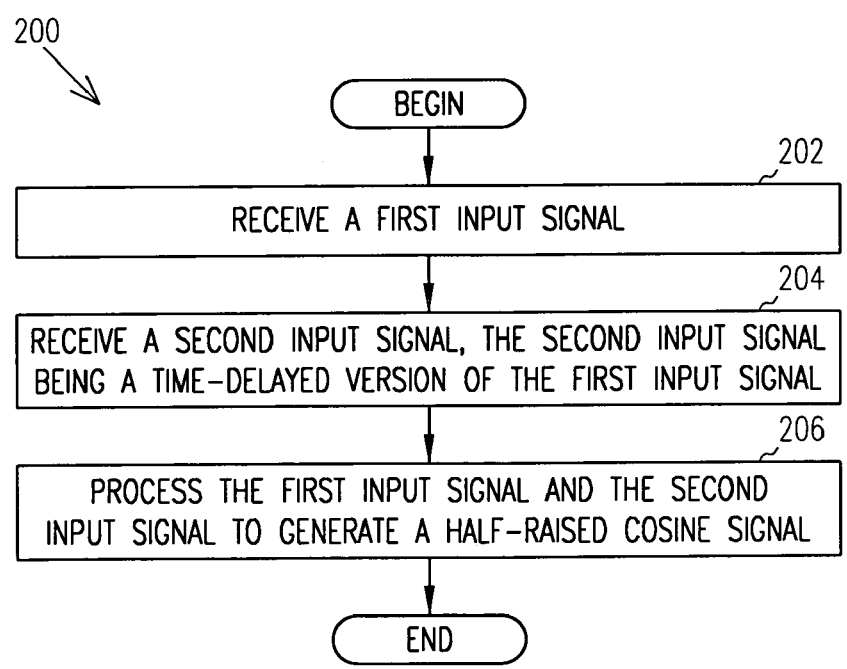
FIG. 2 is a flow diagram of a method for generating a half-raised cosine signal in accordance with some embodiments of the present invention.

FIG. 2 is a flow diagram of a method 200 for generating a half-raised cosine signal in accordance with some embodiments of the present invention. The method 200 includes receiving a first input signal (block 202), receiving a second input signal, the second input signal being a time-delayed version of the first input signal, (block 204), and processing the first input signal and the second input signal to generate a half-raised cosine signal (block 206). In some embodiments, receiving the first input signal includes receiving a digital signal. In some embodiments, receiving the second input signal includes receiving a digital signal. In some embodiments, processing the first input signal and the second input signal comprises providing a signal path including a first driver, an inductor, and a capacitive load for the first input signal and a signal path including a second driver, the inductor, and the capacitive load for the second input signal. In some embodiments, receiving the first input signal includes receiving a low-to-high transition signal.

Figure 3A:
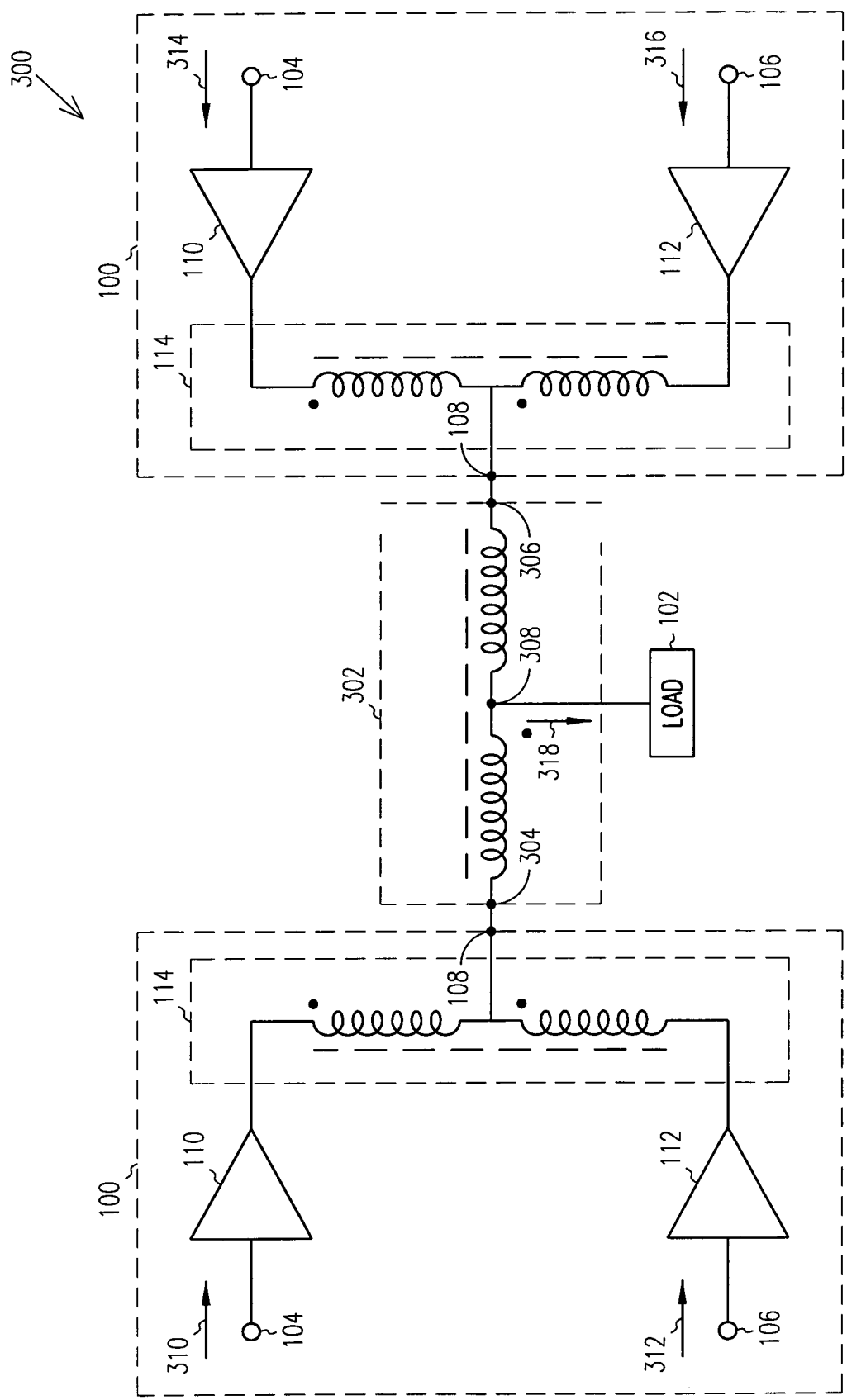
FIG. 3A is a block diagram and a schematic diagram of an apparatus including two instances of the circuit, shown in FIG. 1A, a transformer circuit, and the load, shown in FIG. 1A, in accordance with some embodiments of the present invention.

FIG. 3A is a block diagram and a schematic diagram of an apparatus 300 including two instances of the circuit 100, shown in FIG. 1A, a transformer circuit 302, and the load 102, shown in FIG. 1A, in accordance with some embodiments of the present invention. Each instance of the circuit 100 includes the input ports 104 and 106, the output port 108, the drivers 110 and 112, and the transformer circuit 114. The transformer circuit 302 includes transformer circuit input ports 304 and 306 and a center-tap 308. The output port 108 of one instance of the circuit 100 is coupled to the transformer circuit input port 304. The output port 108 of one instance of the circuit 100 is coupled to the transformer circuit input port 306. The center-tap 308 is coupled to the load 102 at the load input port 142.

The circuit 100, shown in FIG. 3A, is also shown in FIG. 1A and described above. Neither instance of the circuit 100 shown in FIG. 3A includes the clamp circuit 116 or the delay circuit 118. In the description of the circuit 100 provided above, both the clamp circuit 116 and the delay circuit 118 are described as optional and therefore are not required, and are not included, in the instances of the circuit 100 shown in FIG. 3A. For the same load, the total size of the four drivers, included in the two instances of the circuit 100 shown in FIG. 3A, is the same as the total size of the two drivers 110 and 112, included in the circuit 100 shown in FIG. 1A.

Figure 3B:
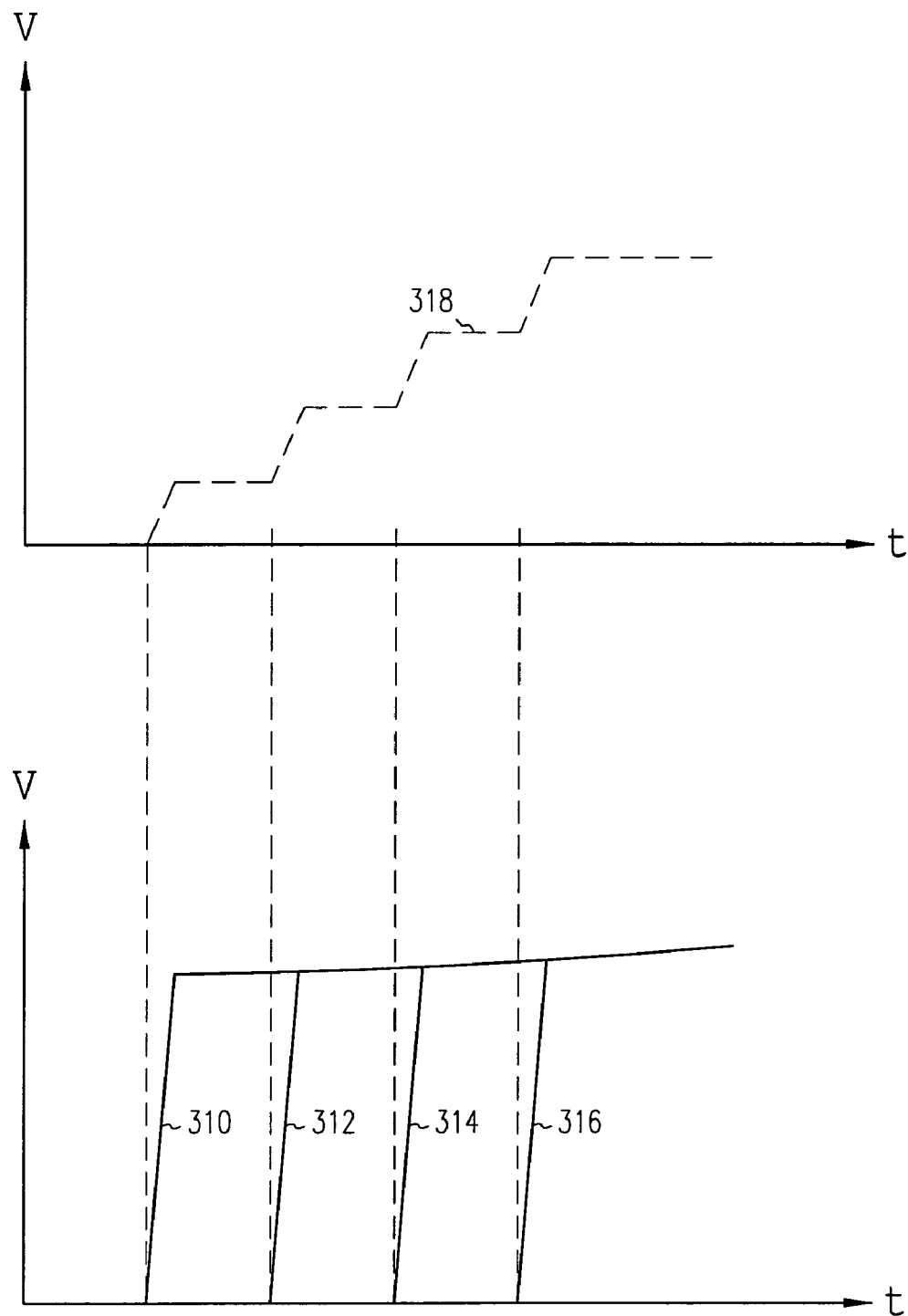
FIG. 3B shows exemplary waveforms in the apparatus, shown in FIG. 3A, for input signals received at the input ports of the circuits and for an output signal provided at the center-tap of the transformer circuit in accordance with some embodiments of the present invention.

FIG. 3B shows exemplary waveforms in the apparatus 300, shown in FIG. 3A, for input signals 310, 312, 314, and 316 received at the input ports 104 and 106 of the circuits 100 and for an output signal 318 provided at the center-tap 308 of the transformer circuit 302 in accordance with some embodiments of the present invention. As can be seen in FIG. 3B, the input signals 312, 314, and 316 are delayed versions of the input signal 310. The input signals 310, 312, 314, and 316 provide for stepwise charging of the load 102. As can be seen in FIG. 3B, the output signal 318, provided to the load 102, includes a series of "steps." The energy conserved is up to 75%, when compared with the energy consumed by a driver that does not include the transformer circuits 114 and 302.

Figure 4:
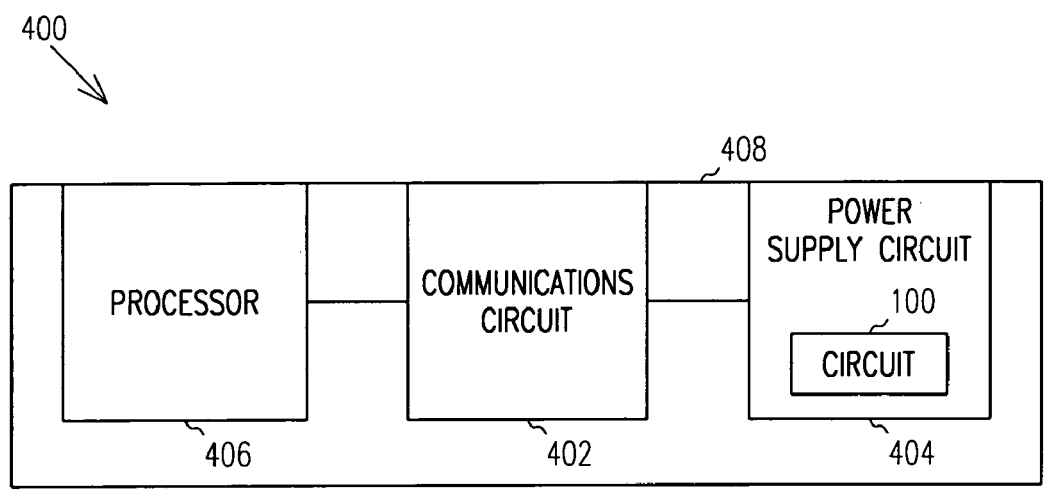
FIG. 4 is a block diagram of an apparatus including a communication circuit, a power supply circuit, a processor, and a substrate in accordance with some embodiments of the present invention.

FIG. 4 is a block diagram of an apparatus 400 including a communication circuit 402, a power supply circuit 404, a processor 406, and a substrate 408 in accordance with some embodiments of the present invention. The communication circuit 402, the power supply circuit 404, and the processor 406 are formed on the substrate 408. The power supply circuit 404 and the processor 406 are coupled to the communication circuit 402. The power supply circuit 404 includes the circuit 100, shown in FIG. 1, and described above.

The communication circuit 402 is not limited to a particular type of communications circuit. Transmitters, receivers, and transceivers are communication circuits suitable for use in connection with the apparatus 400. In some embodiments, the communication circuit 402 includes a communication base station, such as a cellular base station.

The power supply circuit 404 includes the circuit 100 to drive capacitive loads (not shown) in the power supply circuit 404. In some embodiments, the power supply circuit 404 includes a direct-current to direct-current (DC—DC) converter. In some embodiments, the power supply circuit 404 includes a voltage regulation module (VRM).

The processor 406 is not limited to a particular type of processor. In some embodiments the processor 406 includes a reduced instruction set processor. In some embodiments, the processor 406 includes a complex instruction set computing system. In some embodiments, the processor 406 includes a very-long instruction word processor. In some embodiments, the processor 406 includes a digital-signal-processor.

The substrate 408 provides a base on which to form the communication circuit 402, the power supply circuit 404, and the processor 406. The substrate 408 is not limited to a particular type of material. Exemplary substrate materials suitable for use in connection with the apparatus 400 include silicon, germanium, gallium arsenide, and silicon-on-sapphire.

In operation, the communication circuit 402 receives power from the power supply circuit 404. The power supply circuit 404 includes the circuit 100, shown in FIG. 1A, and described above, to drive capacitive loads in the power supply circuit 404. The processor 406 provides computational capability to the communication circuit 402. The communication circuit 402 sends and receives information. In some embodiments, the communication circuit 402 sends information to systems (not shown) not located on the substrate 408 and receives information from systems (not shown) not located on the substrate 408. In some embodiments, the communication circuit 402 sends information to systems (not shown) formed on the substrate 408 and receives information from systems (not shown) formed on the substrate 408.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances of "an embodiment," "one embodiment," or "some embodiments" are not necessarily all referring to the same embodiments.

If the specification states a component, feature, structure, or characteristic "may," "might," or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:
1. A circuit comprising:
a first driver to receive a first signal from a first input port;

a second driver to receive a time-delayed version of the first signal from a second input port; and a transformer coupled to the first driver and the second driver, the transformer to provide an output signal to an output port, the output signal being a half-raised cosine signal corresponding to the first signal and the second signal.

2. The circuit of claim 1, further comprising a capacitive load coupled to the transformer.

3. A circuit comprising:
a first driver to receive a first signal from a first input port;
a second driver to receive a time-delayed version of the first signal from a second input port;
a transformer coupled to the first driver and the second driver, the transformer to provide an output signal to an output port; where the transformer has a leakage inductance and the capacitive load has a capacitance, and the time-delayed version of the first signal is time-delayed with respect to the first signal by a time about equal to a product of pi and a square-root of a product of the leakage inductance and the capacitance; and
a capacitive load coupled to the transformer.

4. The circuit of claim 3, further comprising an inductor coupled to the transformer and a transistor coupled to the inductor.

5. A circuit comprising:
a first driver to receive a first signal from a first input port;
a second driver to receive a time-delayed version of the first signal from a second input port;
a transformer coupled to the first driver and the second driver, the transformer to provide an output signal to an output port;
an inductor coupled to the transformer and a transistor coupled to the inductor in which the inductor has an inductance and the transistor has a capacitance and the time-delayed version of the first signal is time-delayed with respect to the first signal by a time about equal to a product of pi and a square-root of a product of the inductance and the capacitance; and
an inductor coupled to the transformer and a transistor coupled to the inductor.

6. The circuit of claim 5, further comprising a Schmitt trigger circuit to couple the output port to the second input port.

7. The circuit of claim 6, wherein the Schmitt trigger circuit includes a hysteresis value about equal to a supply potential.

8. The circuit of claim 7, further comprising a clamp circuit coupled to the output port, the clamp circuit to hold the output port at the supply potential.

9. An apparatus comprising:
a plurality of circuits, each of the plurality of circuits including a plurality of drivers coupled to a first transformer circuit, wherein the first transformer circuit in each of the plurality of circuits is coupled to a second transformer circuit including a center-tap and each of the plurality of drivers in each of the plurality of driver circuits is coupled to a separate input port; and
an output port connected to the center tap producing a half-raised cosine output signal corresponding to signals on each of the separate input port.

10. The apparatus of claim 9, wherein the first transformer circuit in at least one of the plurality of driver circuits comprises a loosely coupled transformer.

11. The apparatus of claim 10, further comprising a capacitive load coupled to the center-tap.

12. An apparatus comprising:
a plurality of circuits, each of the plurality of circuits including a plurality of drivers coupled to a first transformer circuit, the first transformer circuit in each of the plurality of circuits is coupled to a second transformer circuit including a center-tap and each of the plurality of drivers in each of the plurality of driver circuits is coupled to a separate input port, where the first transformer circuit in at least one of the plurality of driver circuits comprises a loosely coupled transformer, and
a capacitive load coupled to the center-tap, and the capacitive load comprises a complementary metal-oxide field-effect transistor.

13. The apparatus of claim 12, wherein the second transformer comprises an auto-transformer.

14. An apparatus comprising:
a communication circuit formed on a substrate; and
a power supply circuit formed on the substrate to provide power to the communication circuit, the power supply circuit including:
a first driver coupled to an input port;
a delay circuit coupled to the input port;
a second driver coupled to the delay circuit; and
an auto-transformer coupled to the first driver, to the second driver, and to an output port, the output port being coupled to a capacitive load and the capacitive load being coupled to the communication circuit to provide power to the communication circuit.

15. The apparatus of claim 14, wherein the communication circuit comprises a communication base station.

16. The apparatus of claim 15, wherein the transformer includes a leakage inductance, the capacitive load includes a capacitance, and the delay circuit includes a delay about equal to a product of pi and the square-root of a product of the leakage inductance and the capacitance.

17. The apparatus of claim 16, wherein the processor comprises a reduced instruction set processor.

18. The apparatus of claim 14, further comprising a processor coupled to the communication circuit.

19. The apparatus of claim 18, wherein the processor comprises a very-long instruction word processor.

20. A method comprising:
receiving a first input signal;
receiving a second input signal, the second input signal being a time-delayed version of the first input signal; and
processing the first input signal and the second input signal to generate a half-raised cosine signal.

21. The method of claim 20, wherein receiving the first input signal comprises receiving a digital signal.

22. The method of claim 21, wherein receiving the second input signal comprises receiving a digital signal.

23. The method of claim 22, wherein processing the first input signal and the second input signal comprises providing a signal path including a first driver, an inductor, and a capacitive load for the first input signal and a signal path including a second driver, the inductor, and the capacitive load for the second input signal.

24. The method of claim 20, wherein receiving the first input signal comprises receiving a low-to-high transition signal.

* * * * *